(12) United States Patent
Son et al.

(10) Patent No.: US 8,324,056 B2
(45) Date of Patent: Dec. 4, 2012

(54) VERTICAL TYPE SEMICONDUCTOR DEVICE AND METHOD OF MANUFACTURING A VERTICAL TYPE SEMICONDUCTOR DEVICE

(75) Inventors: Yong-Hoon Son, Yongin-si (KR); Jong-Wook Lee, Yongin-si (KR); Jong-Hyuk Kang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/317,022

(22) Filed: Oct. 7, 2011

(65) Prior Publication Data

US 2012/0028428 A1 Feb. 2, 2012

Related U.S. Application Data

(62) Division of application No. 12/588,948, filed on Nov. 3, 2009, now Pat. No. 8,063,441.

(30) Foreign Application Priority Data

Nov. 3, 2008 (KR) .......................... 10-2008-0108534

(51) Int. Cl.
*H01L 21/336* (2006.01)
*H01L 21/8238* (2006.01)

(52) U.S. Cl. ........ 438/270; 438/268; 438/275; 438/277; 438/278; 257/206; 257/207; 257/212; 257/268; 257/328; 257/329; 257/330; 257/332; 257/E21.252; 257/E21.645; 257/E21.652; 257/E21.657

(58) Field of Classification Search .................. 438/268, 438/270, 275, 277, 278; 257/206, 207, 212, 257/268, 328, 329, 330, 332, E21.252, E21.645, 257/E21.652, E21.657

See application file for complete search history.

(56) References Cited

U.S. PATENT DOCUMENTS

| | | | | | |
|---|---|---|---|---|---|
| 5,723,370 | A | * | 3/1998 | Ning et al. | 438/156 |
| 6,077,745 | A | * | 6/2000 | Burns et al. | 438/270 |
| 6,150,687 | A | * | 11/2000 | Noble et al. | 257/302 |
| 6,239,022 | B1 | | 5/2001 | Seo et al. | |
| 6,337,497 | B1 | | 1/2002 | Hanafi et al. | |
| 6,566,682 | B2 | * | 5/2003 | Forbes | 257/51 |
| 7,220,634 | B2 | * | 5/2007 | Prall et al. | 438/216 |
| 7,767,525 | B2 | * | 8/2010 | Manning et al. | 438/268 |
| 7,851,309 | B2 | * | 12/2010 | Leslie | 438/269 |
| 2010/0213539 | A1 | * | 8/2010 | Masuoka et al. | 257/329 |

FOREIGN PATENT DOCUMENTS

| | | |
|---|---|---|
| EP | 1 091 413 | 4/2001 |
| KR | 10-2001-0061118 | 7/2001 |
| KR | 10-2003-0031600 | 4/2003 |

* cited by examiner

*Primary Examiner* — Dao H Nguyen

(74) *Attorney, Agent, or Firm* — Harness, Dickey & Pierce, P.L.C.

(57) ABSTRACT

A vertical pillar semiconductor device may include a substrate, a group of channel patterns, a gate insulation layer pattern and a gate electrode. The substrate may be divided into an active region and an isolation layer. A first impurity region may be formed in the substrate corresponding to the active region. The group of channel patterns may protrude from a surface of the active region and may be arranged parallel to each other. A second impurity region may be formed on an upper portion of the group of channel patterns. The gate insulation layer pattern may be formed on the substrate and a sidewall of the group of channel patterns. The gate insulation layer pattern may be spaced apart from an upper face of the group of channel patterns. The gate electrode may contact the gate insulation layer and may enclose a sidewall of the group of channel patterns.

11 Claims, 14 Drawing Sheets

VERTICAL TYPE SEMICONDUCTOR DEVICE AND METHOD OF MANUFACTURING A VERTICAL TYPE SEMICONDUCTOR DEVICE

CROSS REFERENCE TO RELATED APPLICATION

This application is a divisional of application Ser. No. 12/588,948, filed Nov. 3, 2009 now U.S. Pat. No. 8,063,441, which claims priority under U.S.C. §119 to Korean Patent Application No. 10-2008-0108534, filed on Nov. 3, 2008, in the Korean Intellectual Property Office (KIPO), the entire contents of each of which are incorporated herein by reference.

BACKGROUND

1. Field

Example embodiments relate to a vertical type semiconductor device and a method of manufacturing a vertical type semiconductor device. More particularly, example embodiments relate to a vertical type semiconductor device having a multi-channel and a method of manufacturing a vertical type semiconductor device having a multi-channel.

2. Description of the Related Art

An active region becomes small according to a higher integration of a semiconductor device, so that a channel length of a MOS transistor formed in the active region may be reduced. When the channel length of a MOS transistor becomes small, a source/drain region has an effect on an electric field or an electric potential of the channel region, which may be called a short channel effect. When the short channel effect is generated, a leakage current may be increased, a breakdown voltage may be lowered and a current affected by a drain may be increased. As a result, the MOS transistor may be difficult to be controlled by a gate.

Many methods for reducing a size of devices formed on a substrate and maximizing or increasing performance of the devices have been developed. For example, a vertical type semiconductor device of which a channel may be formed along a direction substantially perpendicular to a substrate has been developed. The vertical type semiconductor device uses a semiconductor pattern of a pillar shape (hereinafter, a semiconductor pillar) on a substrate as a channel region. The vertical type semiconductor device may adjust a channel length by increasing the semiconductor pillar instead of increasing a horizontal area of the substrate.

In the vertical type semiconductor device, reducing a width of the semiconductor pillar may be needed for reducing a leakage current and obtaining a higher integration degree. However, when the width of the semiconductor pillar is reduced, a channel region formed through the semiconductor pillar may also be decreased. As a result, on-current of the vertical type semiconductor device may be reduced when the width of the semiconductor pillar is reduced.

SUMMARY

Example embodiments provide a semiconductor device including a vertical pillar transistor having a multi-channel. Example embodiments provide a method of manufacturing a semiconductor device including a vertical pillar transistor having a multi-channel.

According to example embodiments, a vertical pillar semiconductor device may include a substrate divided into an active region and an isolation layer, a first impurity region in the substrate corresponding to the active region; a group of channel patterns protruding from a surface of the active region and arranged parallel to each other, a second impurity region on an upper portion of the group of channel patterns; a gate insulation layer pattern on the substrate and a sidewall of the group of channel patterns, the gate insulation layer pattern spaced apart from an upper face of the group of channel patterns; and a gate electrode configured to contact the gate insulation layer and enclosing a sidewall of the group of channel patterns.

In example embodiments, the group of channel patterns may be in a pillar shape. The group of channel patterns may be a single crystalline silicon pattern. The vertical pillar semiconductor device may further include a hard mask pattern enclosing an upper sidewall of the group of channel patterns and on the gate electrode; and an etch stop layer pattern on a surface of the isolation layer. The etch stop layer pattern may include silicon nitride.

In example embodiments, the vertical pillar semiconductor device may further include an insulating interlayer covering the gate electrode; a bit line structure over the gate electrode and configured to electrically connect to the first impurity region; and a capacitor on the bit line structure and configured to electrically connect to the second impurity region on the group of channel patterns. The active region and the isolation layer may have a shape extending along a first direction. The active region may have a width the same as or larger than a critical width of a photolithography process. The group of channel patterns may be arranged along a second direction in a given interval substantially perpendicular to the first direction.

In example embodiments, the hard mask pattern may have a linear shape extending along a second direction and includes silicon nitride. An upper face of the hard mask pattern may be at the same level or a higher level as that of the group of channel patterns. The gate insulation layer pattern may be spaced apart from the upper face of the group of channel patterns by the hard mask pattern. The gate electrode may have a linear shape extending along the second direction and includes one of a polysilicon material and a metal. In example embodiments, the second impurity region may extend from the upper face of the group of channel patterns to at least a lower face of the hard mask pattern.

According to example embodiments, a method of manufacturing a vertical pillar semiconductor device may include forming a group of channel patterns on a substrate divided into an active region and an isolation layer, the group of channel patterns arranged parallel to each other and a first impurity region formed in the substrate corresponding to the active region; forming a gate insulation layer on a surface of the substrate and a sidewall of the group of channel patterns, the gate insulation layer spaced apart from an upper face of the group of channel patterns; and forming a gate electrode contacting the gate insulation layer and enclosing a sidewall of the group of channel patterns.

In example embodiments, forming the group of channel patterns may include forming a first sacrificial layer pattern exposing the active region; forming amorphous silicon spacers on a sidewall of the first sacrificial layer pattern; forming a second sacrificial layer pattern to fill a gap between the amorphous silicon spacers; and performing phase-transition of the amorphous silicon spacers into single crystalline silicon. The phase transition may be performed by a laser epitaxial growth (LEG) process or a solid phase epitaxial growth (SPE) process.

In example embodiments, forming the first sacrificial layer pattern may further include stacking a lower pattern including a first material and an upper pattern of insulation material including a second material having an etching selectivity with respect to the first material. The method may further include forming a hard mask layer on the first and second sacrificial layer patterns; forming a hard mask pattern by patterning the hard mask layer and the upper pattern of the first sacrificial layer pattern; and removing the second sacrificial layer pattern and the lower pattern of the first sacrificial layer pattern with the hard mask pattern. Forming the gate electrode may include forming a conductive layer filling a space below the hard mask pattern; and patterning the conductive layer to remove a portion of the conductive layer exposed by the hard mask pattern.

According to example embodiments, the vertical type semiconductor device includes a vertical pillar transistor having a multi-channel. The vertical type semiconductor device may have a sufficient on-current even when the vertical pillar transistor may be formed on a substrate of which a horizontal area may be very small. Thus, the vertical type semiconductor device according to example embodiments has a higher operation speed.

BRIEF DESCRIPTION OF THE DRAWINGS

Example embodiments will be more clearly understood from the following detailed description taken in conjunction with the accompanying drawings.

FIG. 1 is a cross-sectional view illustrating a vertical pillar transistor in accordance with example embodiments;

FIG. 2 is a perspective view illustrating a vertical pillar transistor in FIG. 1;

FIG. 3 is a plan view illustrating a vertical pillar transistor in FIG. 1;

FIGS. 4 to 10, 12 and 14 are cross-sectional views illustrating a method of manufacturing the vertical pillar transistor in accordance with example embodiments;

FIGS. 11 and 13 are perspective view illustrating a method of manufacturing the vertical pillar transistor in accordance with example embodiments;

FIGS. 15 and 16 are cross-sectional views illustrating other method of manufacturing the vertical pillar transistor in accordance with example embodiments;

FIGS. 17 to 20 are cross-sectional views illustrating other method of manufacturing the vertical pillar transistor in accordance with example embodiments;

FIG. 21 is a cross-sectional view illustrating a DRAM device including a vertical pillar transistor in FIG. 1;

FIGS. 22 and 23 are illustrating a method of manufacturing the vertical pillar transistor in FIG. 21;

FIG. 24 is a cross-sectional view illustrating a vertical pillar transistor in accordance with example embodiments; and FIG. 25 is a cross-sectional view illustrating a method of manufacturing the vertical pillar transistor in accordance with example embodiments.

Figure 1:
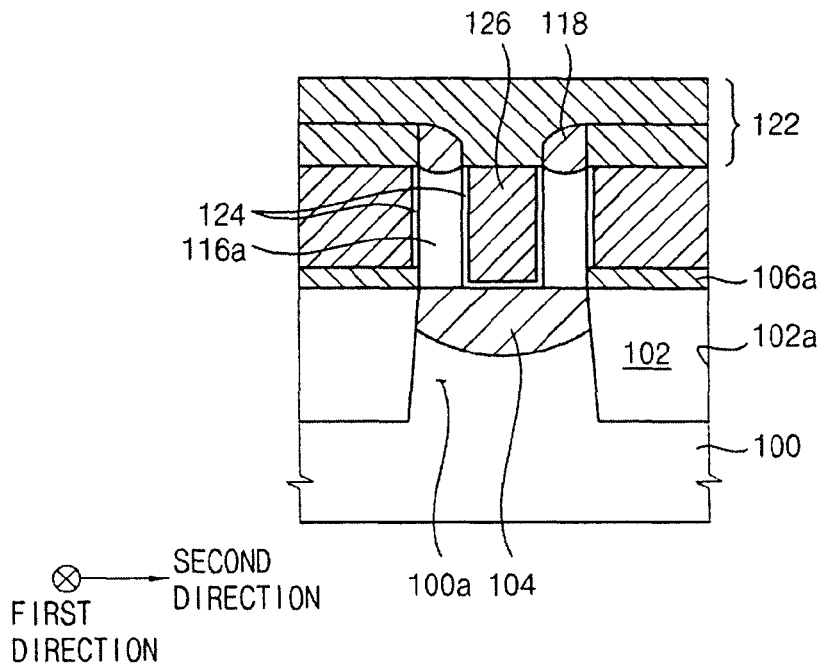
FIGS. 1 to 25 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Various example embodiments will be described more fully hereinafter with reference to the accompanying drawings, in which some example embodiments are illustrated. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
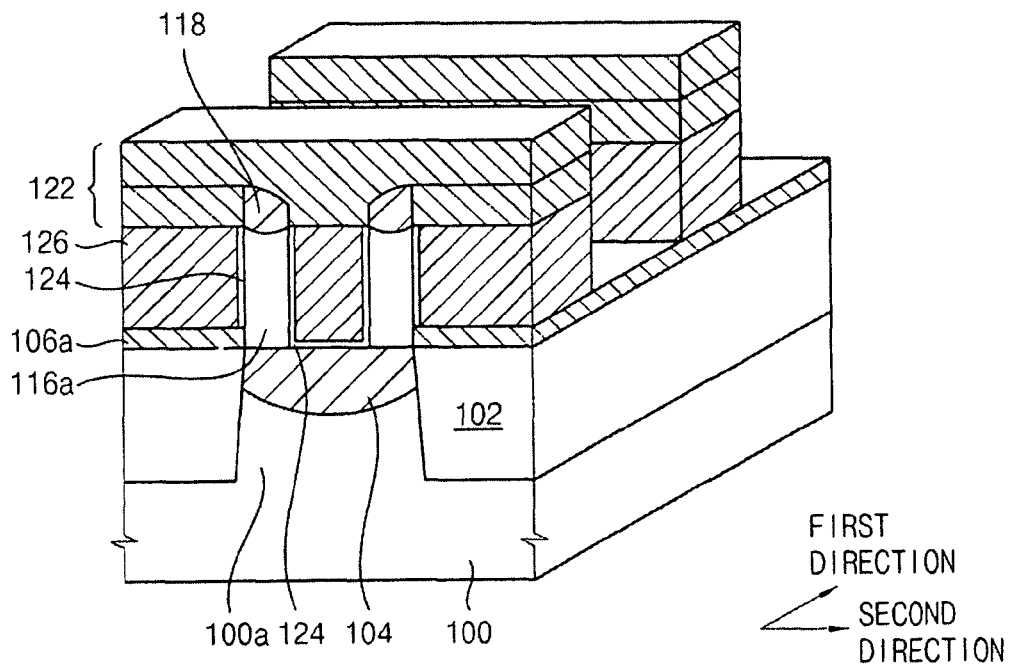
Figure 3:
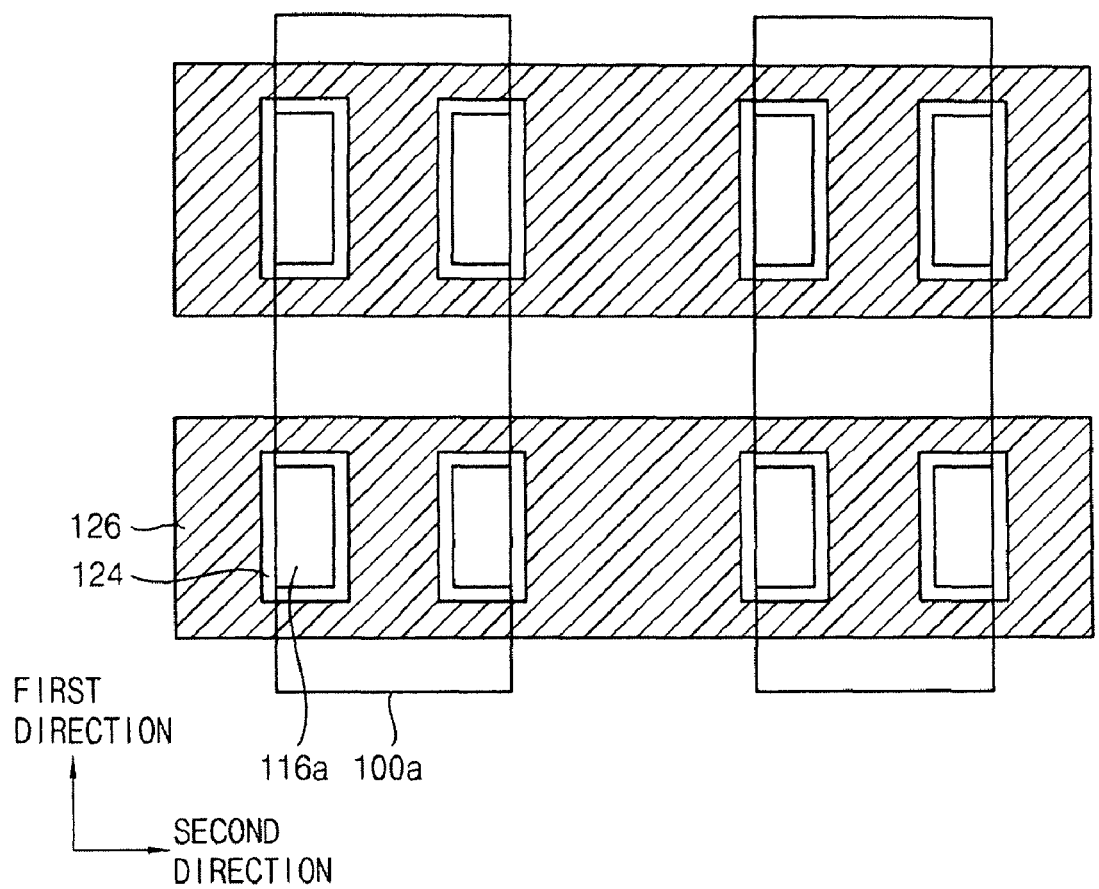

FIG. 1 is a cross-sectional view illustrating a vertical pillar transistor in accordance with example embodiments. FIG. 2 is a perspective view illustrating a vertical pillar transistor in FIG. 1. FIG. 3 is a plan view illustrating a vertical pillar transistor in FIG. 1. In example embodiments, the vertical pillar transistor has an array structure. However, the vertical pillar transistor may not have an array structure and the structure of the vertical pillar transistor may not be limited to the array structure.

Referring to FIGS. 1 to 3, a substrate 100 having an active region 100a and an isolation layer 102 may be prepared. The substrate 100 may include single crystalline semiconductor material. A trench 102a may be formed at an upper portion of the substrate 100 and the trench 102a may be filled with the isolation layer 102. The active region 100a and the isolation layer 102 have a shape extending along a first direction. The active region 100a and the isolation layer 102 may be alternatively formed at an upper portion of the substrate 100. One active region 100a interposed between the adjacent isolation layers 102 may be named a unit active region.

The active region 100a may have a width substantially the same as or larger than a critical width of a photolithography process. When the active region 100a has a width substantially the same as the critical width of a photolithography process, a device may be highly integrated. A first impurity region 104 may be formed under a surface of the substrate 100 corresponding to the active region 100a. The first impurity region 104 may serve as a source region or a drain region. An etch stop layer pattern 106a may be formed on a surface of the isolation layer 102. The etch stop layer pattern 106a may include silicon nitride.

Channel patterns 116a may be formed on the substrate 100 corresponding to the active region 100a. The channel patterns 116a substantially upright protrude from the active region 100a. Channel patterns 116a may be arranged along a second direction substantially perpendicular to the first direction. In example embodiments, two of the channel patterns 116a may be arranged on the each unit active region 100a in the second direction.

However, three or more channel patterns 116a may be arranged on each unit active region 100a in the second direction. The two channel patterns 116a serve as a channel region of one vertical semiconductor device. Hereinafter, the two channel patterns 116a serving as a channel region of one vertical semiconductor device may be named a first group of channel patterns 116a.

As illustrated in FIG. 2, the first group of channel patterns 116a may be repeatedly formed along the second direction with a predetermined or given interval. Thus, the vertical pillar transistor may have an array structure.

The channel patterns 116a may include single crystalline semiconductor material. For example, the channel patterns 116a may include single crystalline silicon. The channel patterns 116a may be formed by a laser epitaxial growth process or a selective epitaxial growth process. For example, the channel patterns 116a may be formed by a laser epitaxial growth (LEG) process. When the channel patterns 116a are formed by a LEG process, the channel patterns 116a may have few defects. Each of the channel patterns 116a may have a rectangular shape.

A hard mask pattern 122 enclosing an upper sidewall of the channel patterns 116a may be formed. The hard mask pattern 122 has a linear shape extending along the second direction. The hard mask pattern 122 surrounds each of the upper portions of the channel patterns 116a formed on the unit active region 100a. A plurality of the hard mask patterns 122 may be parallel to each other along the first direction. Thus, an upper sidewall of the first group of the channel patterns 116a formed on the substrate 100 may be surrounded by the hard mask patterns 122.

An upper face of the hard mask pattern 122 may have substantially the same level as that of the channel pattern 116a. In example embodiments, the hard mask pattern 122 may have the upper face substantially higher than that of the channel pattern 116a as illustrated in FIG. 1. The hard mask pattern 122 may include silicon nitride.

A gate insulation layer 124 may be formed on a sidewall of the first group of the channel patterns 116a positioned under the hard mask pattern 122. The gate insulation layer pattern 124 may be spaced apart from an upper face of the channel patterns 116a by the hard mask pattern 122. The gate insulation layer 124 may be formed on the substrate 100 corresponding to the active region 100a.

The gate insulation layer 124 may be formed by thermally oxidizing a side surface of the first group of the channel patterns 116a. The gate insulation layer 124 on the sidewall of the first group of the channel patterns 116a serves as a gate insulation layer of a vertical pillar transistor. The gate insulation layer 124 on the substrate 100 corresponding to the active region 100a insulates the substrate 100 from a gate electrode 126. The gate electrode 126 makes contact with the gate insulation layer 124 and encloses the first group of the channel patterns 116a. The gate electrode 126 fills a gap between the adjacent first groups of the channel patterns 116a.

The gate electrode 126 has a linear shape extending along the second direction. Thus, the gate electrode 126 encloses the first groups of the channel patterns 116a on each unit active region 100a. The gate electrode 126 and the hard mask pattern 122 may have outside sidewalls substantially perpendicular to the substrate 100, respectively. The gate electrode 126 may have an outside sidewall continuously connected to that of the hard mask pattern 122. The gate electrode 126 and the hard mask pattern 122 have no step portion on sidewalls thereof.

The gate electrode 126 may include polysilicon material. Alternatively, the gate electrode 126 may include metal. The first impurity region 104 may extend from under a surface of the substrate 100 to under the channel pattern 116a by diffusion of impurities. A second impurity region 118 may be formed in an upper portion of the first group of the channel patterns 116a. The second impurity region 118 serves as a source region or a drain region. The second impurity region 118 extends from an upper face of the first group of the channel patterns 116a to at least a lower face of the hard mask pattern 122.

The vertical pillar transistor includes the first group of channel patterns 116a, the gate electrode 126 enclosing the first group of channel patterns 116a, and the impurity regions on the substrate 100 under the first group of channel patterns 116a and on the first group of channel patterns 116a. When the vertical pillar transistor is operated, channels may be formed on a surface of the first group of channel patterns 116a, respectively. As a result, the vertical pillar transistor may have a higher operation speed because of increased on-current. Two or more channel patterns may be formed along the second direction without increasing a width of the unit active region 100a more than a design rule. Thus, the vertical pillar transistor may be highly integrated.

Figure 4:
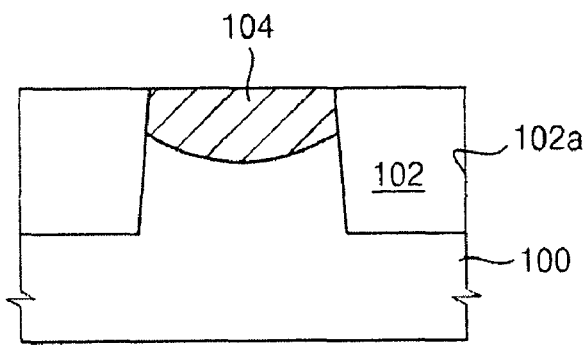

FIGS. 4 to 10, 12 and 14 are cross-sectional views illustrating a method of manufacturing the vertical pillar transistor in accordance with example embodiments. Referring to FIG. 4, a substrate 100 including single crystalline semiconductor may be prepared. For example, the substrate 100 may include single crystalline silicon. A shallow trench isolation process may be performed to the substrate 100 to form an isolation layer 102. Particularly, an upper portion of the substrate 100 may be partially etched to form a trench 102a along a first direction. The trench 102a may be filled with an insulation material to form the isolation layer 102.

The substrate 100 may be divided into an active region 100a and the isolation layer 102. The active region 100a and the isolation layer 102 have a linear shape extending along the first direction and may be alternatively arranged. The active region 100a and the isolation layer 102 have a width substantially the same as or larger than a minimum width obtained from a photolithography process.

Impurities may be ion-implanted into the substrate 100 to form a first impurity region 104. For example, n-type impurities may be implanted into the substrate. The impurity region may be formed before forming the isolation layer 102. In example embodiments, impurities implanted into a portion of the substrate may be removed by the shallow trench isolation process, so that the first impurity region 104 may be only formed on the active region 100a.

Figure 5:
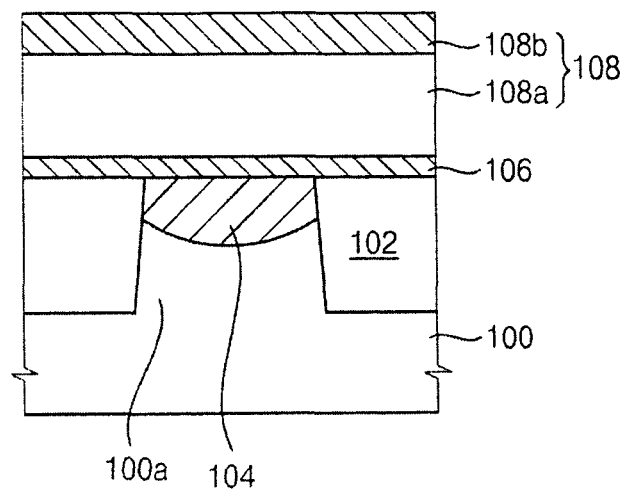

Referring to FIG. 5, an etch stop layer 106, preliminary layers 108 including a first sacrificial layer 108a and a first preliminary hard mask layer 108b may be sequentially formed on the substrate 100. The first sacrificial layer 108a has an etching selectivity with respect to the first preliminary hard mask layer 108b and the etch stop layer 106. When the first sacrificial layer 108a is removed in a successive process, the first preliminary hard mask layer 108b and the etch stop layer 106 remains over the substrate 100. For example, the first preliminary hard mask layer 108b and the etch stop layer 106 include silicon nitride, and the first sacrificial layer 108a includes silicon oxide. The first sacrificial layer 108a may be formed by a high-density plasma chemical vapor deposition (HDP-CVD) process.

A sum of thicknesses of the first sacrificial layer 108a, the first preliminary hard mask layer 108b and the etch stop layer 106 decide a height of a channel pattern formed in a successive process. Thus, the sum of thicknesses of the first sacrificial layer 108a, the first preliminary hard mask layer 108b and the etch stop layer 106 may be substantially the same as or higher than a desirable height of the channel pattern.

A vertical thickness of the first preliminary hard mask layer 108b decides a vertical depth of a second impurity region of a vertical pillar transistor. A vertical thickness of the first sacrificial layer 108a decides a height of a gate electrode. Thus, the height of the channel pattern, the depth of the second impurity region and the height of the gate electrode may be adjusted by adjusting thicknesses of the first sacrificial layer 108a and the first preliminary hard mask layer 108b, respectively.

Figure 6:
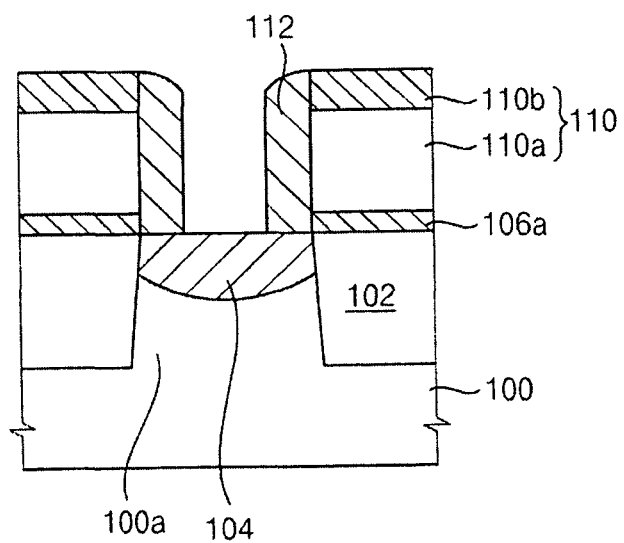

Referring to FIG. 6, a photoresist layer may be coated on the first preliminary hard mask layer 108b and the photoresist layer may be patterned to form a first photoresist layer pattern (not illustrated). The first photoresist layer pattern has a linear shape selectively exposing a portion of the first preliminary hard mask layer 108b corresponding to the active region 100a.

The first preliminary hard mask layer 108b, the first sacrificial layer 108a and the etch stop layer 106 may be sequentially etched using the first photoresist layer pattern as an etching mask. As a result, an etch stop layer pattern 106a and a first sacrificial layer pattern 110 including a lower pattern 110a and an upper pattern 110b may be formed on the substrate 100. For example, the first sacrificial layer pattern 110 has a structure in which a silicon oxide layer pattern and a silicon nitride layer pattern may be stacked. The first sacrificial layer pattern 110 exposes a surface of the active region 100a.

An amorphous silicon layer (not illustrated) may be formed along surfaces of the first sacrificial layer pattern 110 and the substrate 100. The amorphous silicon layer may be formed by a chemical vapor deposition (CVD) process. Alternatively, the amorphous silicon layer may be replaced with a polysilicon layer. The amorphous silicon layer may be anisotropically etched to form an amorphous silicon pattern 112 having a spacer shape on a sidewall of the first sacrificial layer pattern 110.

Figure 7:
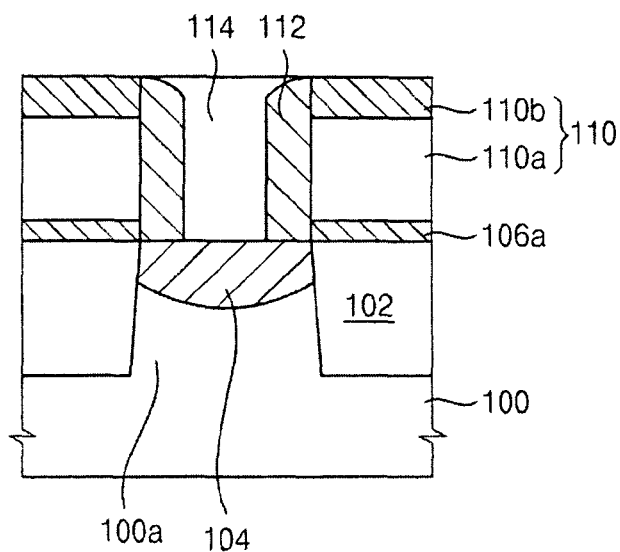

Referring to FIG. 7, a second sacrificial layer 114 may fill a gap between the amorphous silicon patterns 112. The second sacrificial layer 114 may include material substantially the same as the lower pattern 110a of the first sacrificial layer pattern 110. For example, the second sacrificial layer 114 may include silicon oxide. The second sacrificial layer 114 may be polished to expose an upper face of the first sacrificial layer pattern 108a. The second sacrificial layer 114 only remains between the amorphous silicon patterns 112 by the polishing process.

Figure 8:
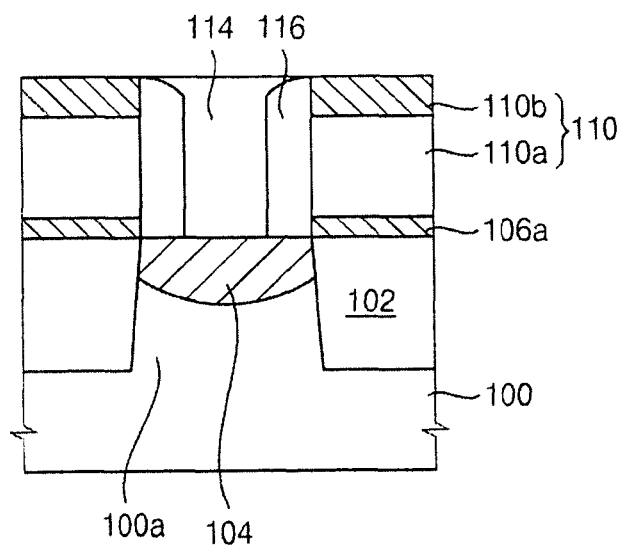

Referring to FIG. 8, the amorphous silicon pattern 112 may be thermally treated to form a preliminary channel pattern 116 including single crystalline silicon. The preliminary channel pattern 116 may be formed by a laser epitaxial growth (LEG) process and/or a solid phase epitaxial growth (SPE) process. For example, the thermal heat process may be formed using a laser or a furnace. When the preliminary channel pattern 116 is formed by a LEG process, the laser used in the LEG process has an energy density sufficiently capable of melting the amorphous silicon patterns 112.

Particularly, the amorphous silicon patterns 112 may be melted by scanning the laser to the amorphous silicon patterns 112, so that the amorphous silicon patterns 112 of solid phase may be converted into liquid phase. That is, a phase transition into a liquid phase occurs from an upper surface of the amorphous silicon patterns 112 to an upper surface of the substrate 100. The laser may be scanned in a temperature of about 1,410° C., which may be a melting point of silicon. Single crystalline structure of the substrate 100 serves as a seed for the amorphous silicon patterns 112 to be converted into the liquid phase. As a result, a crystalline structure of the amorphous silicon patterns 112 may be converted into single crystalline structure. A laser member for scanning the laser may include an excimer laser which may be a kind of gas laser. The laser member may have a structure capable of scanning the laser in a short time.

When the laser is scanned, the substrate 100 may be heated. A temperature gradient of a thin film in which the phase transition of the amorphous silicon patterns 112 occurs may be reduced by heating the substrate 100. For example, the substrate 100 may be heated at a temperature of about 400° C. when the laser may be scanned. A preliminary channel pattern 116 may be formed by converting a crystalline structure of the amorphous silicon patterns 112 into single crystalline structure by scanning the laser on the amorphous silicon patterns 112.

Figure 9:
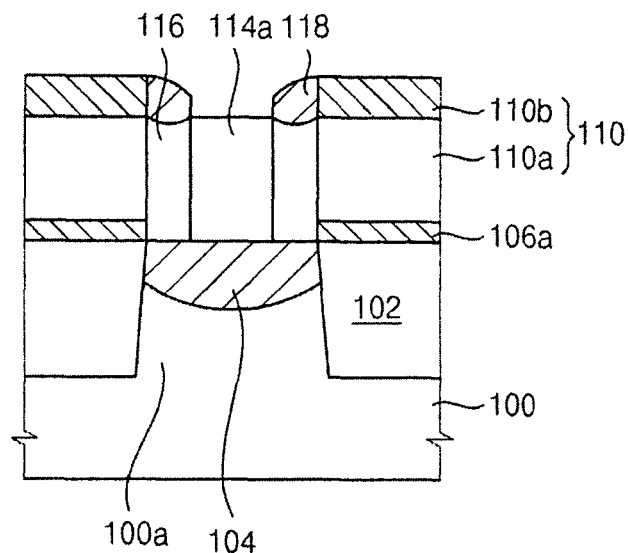

Referring to FIG. 9, impurities may be implanted into an upper portion of the preliminary channel pattern 116 to form a second impurity region 118. The second impurity region 118 may serve as a source region or a drain region of a transistor. The second impurity region 118 may extend to a position adjacent to a lower surface of the upper pattern 110b of the first sacrificial layer pattern 110.

An upper portion of the second sacrificial layer 114 may be etched to form a second sacrificial layer pattern 114a having a thickness substantially smaller than that of the second sacrificial layer 114. An opening may be formed through the second sacrificial layer 114 by the etching process. Alternatively, the second impurity region 118 may be formed after forming the opening by etching the second sacrificial layer 114.

Figure 10:
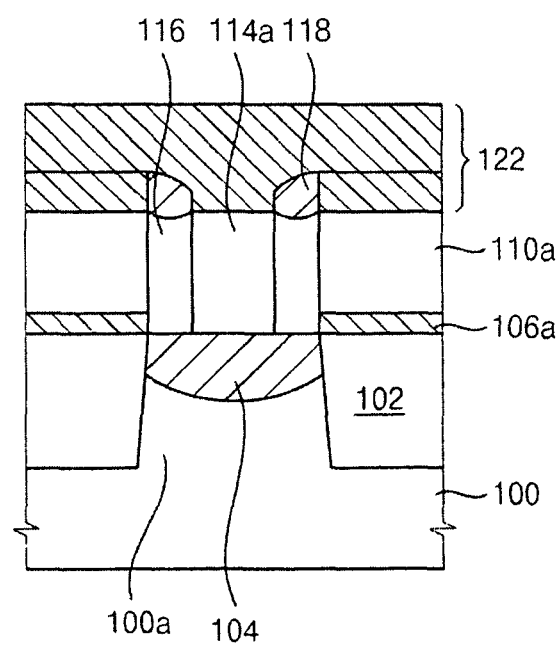

Referring to FIG. 10, a second hard mask layer may be formed on the first sacrificial layer pattern 110 and the second sacrificial layer pattern 114a to fill the opening. The second hard mask layer may be formed using material substantially the same as the upper pattern 110b of the first sacrificial layer pattern 110. For example, the second hard mask layer may be formed using silicon nitride. The second hard mask layer and the upper pattern 110b may be patterned by a photolithography process to form a hard mask pattern 122. The hard mask pattern 122 has a linear shape extending along the second direction.

Figure 11:
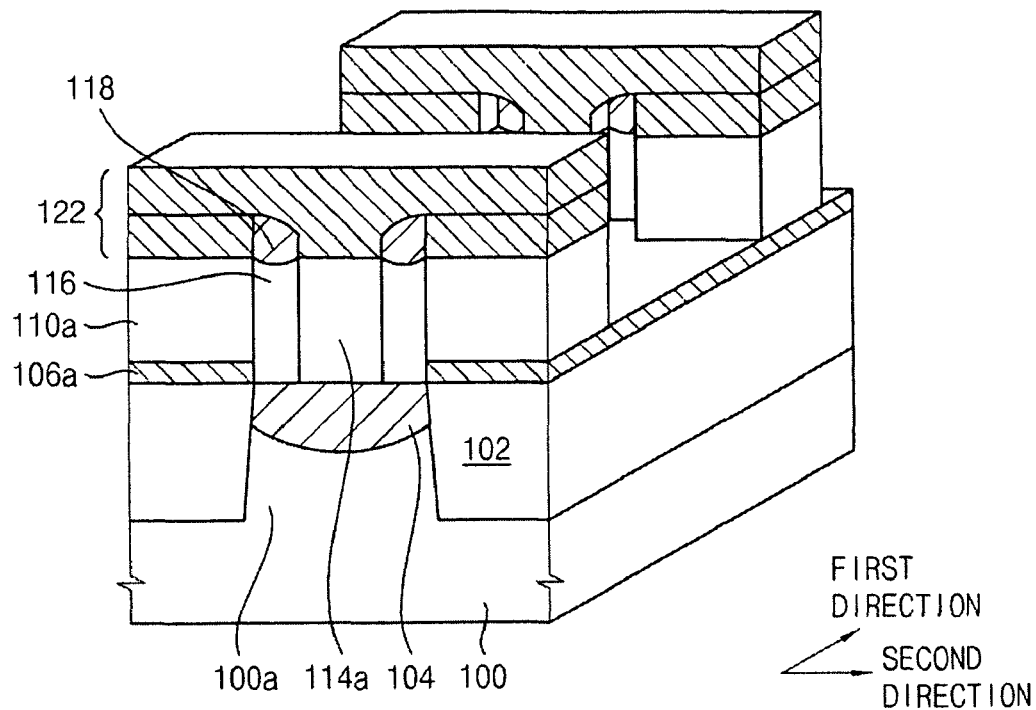
Figure 12:
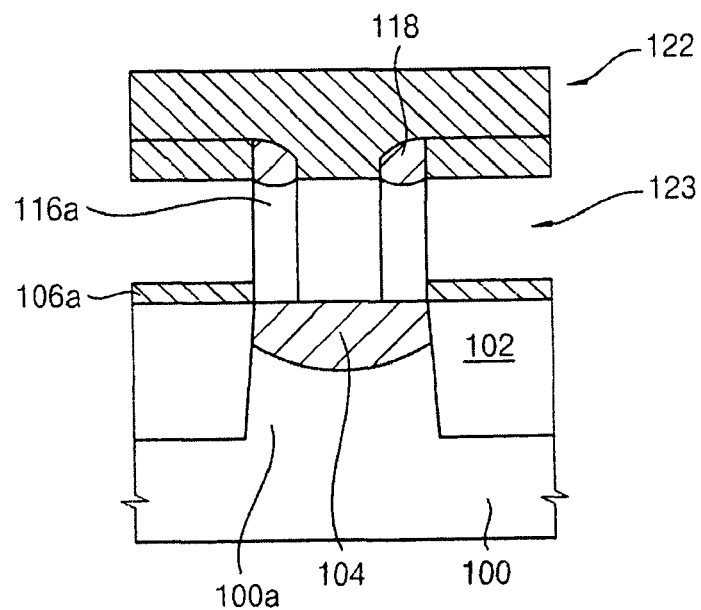
Figure 13:
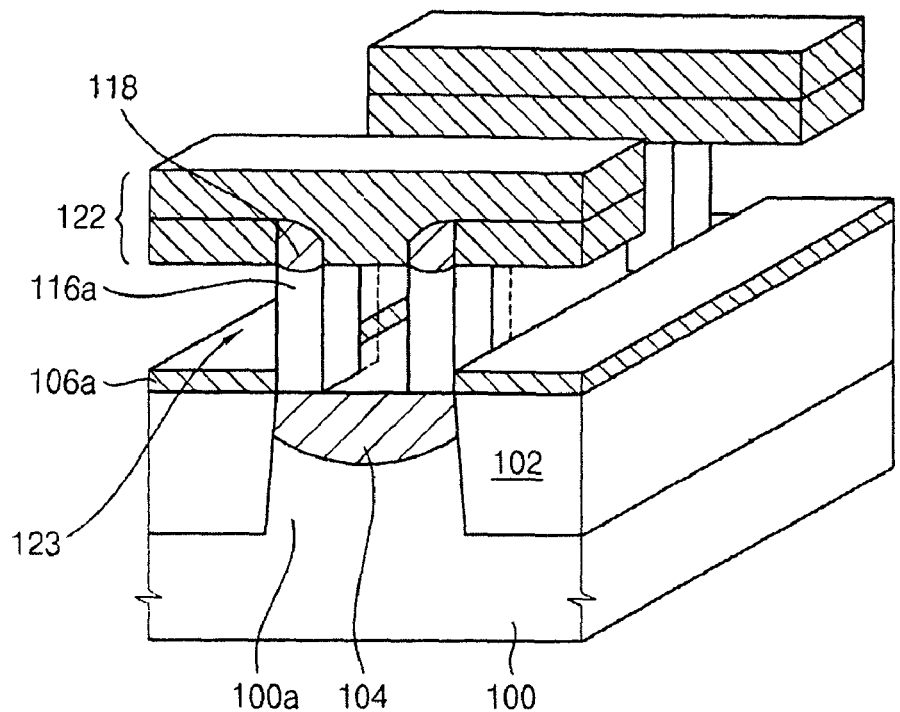

FIGS. 11 and 13 are perspective view illustrating a method of manufacturing the vertical pillar transistor in accordance with example embodiments. Referring to FIGS. 11 and 12, the lower pattern 110a of the first sacrificial layer pattern 110 and the second sacrificial layer pattern 114a may be etched using the hard mask pattern 122 as an etching mask. Accordingly, a preliminary channel pattern 116 may be exposed. The exposed preliminary channel pattern 116 may be etched using the hard mask pattern 122 as an etching mask to form preliminary channel patterns 116 having an individually isolated shape.

A trimming process partially etching the exposed sidewall of the preliminary channel patterns 116 may be performed to form a channel pattern 116a. The channel pattern 116a may have a width smaller than the preliminary channel patterns 116 having an individually isolated shape. For example, the width of the channel pattern 116a may be reduced along the first direction by the trimming process.

In example embodiments, two channel patterns 116a parallel to each other along the second direction may be formed on the active region 100a having a linear shape. Also, the two channel patterns 116a on the active region 100a may be provided as an element for forming one transistor. The two channel patterns 116a may be a first group of channel patterns 116a.

Referring to FIGS. 12 and 13, the lower pattern 110a of the first sacrificial layer pattern 110 and the second sacrificial layer pattern 114a under the hard mask pattern 122 may be completely removed by an isotropic etching process. The hard mask pattern 122 and the etch stop layer 106a may not be etched by the isotropic etching process. The isolation layer 102 may not be removed, but protected by the etch stop layer 106a.

A gap 123 may be formed between the hard mask pattern 122 and the substrate 100, and between the channel patterns 116a. The hard mask pattern 122 may not be supported by the lower pattern 110a, but only supported by the channel patterns 116a. The hard mask pattern 122 has a linear shape enclosing the channel patterns 116a arranged along the second direction. Accordingly, sidewalls of the channel patterns 116a under the hard mask pattern 122 may be exposed. Also, a surface of the active region 100a may be exposed.

Figure 14:
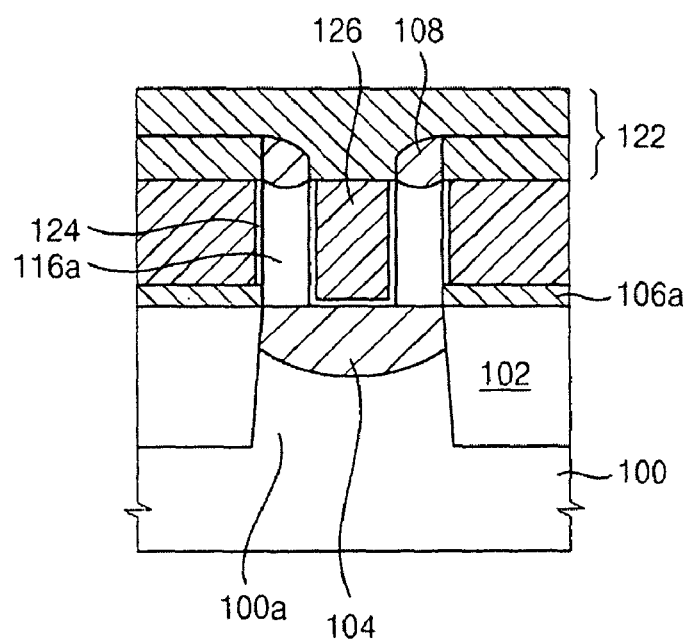

Referring to FIG. 14, a gate insulation layer 124 may be formed by thermally oxidizing the exposed sidewalls of the channel patterns 116a and a surface of the active region 100a. The gate insulation layer 124 may include silicon oxide by the thermal oxidization process. The gate insulation layer 124 on the sidewalls of the channel patterns 116a serve as a gate insulation layer of a vertical pillar transistor. The gate insulation layer 124 on the active region 100a electrically insulates a gate electrode 126 from the substrate 100.

The gap 123 below the hard mask pattern 122 and between the hard mask patterns 122 may be filled with a conductive layer (not shown). The conductive layer may be formed using polysilicon and/or metal. Referring to FIGS. 1 to 3 again, a portion of the conductive layer exposed by the hard mask patterns 122 may be removed using the hard mask pattern 122 as an etching mask. Accordingly, the gate electrode 126 may be formed under the hard mask pattern 122.

The gate electrode 126 encloses the first group of the channel patterns 116a and extends along the second direction. The gate electrode 126 has a shape enclosing the first groups of the channel patterns 116a on each unit active region 100a. The gate electrode 126 and the hard mask pattern 122 have an outside sidewall having no step portion therebetween. For example, the outside sidewalls of the gate electrode 126 and the hard mask pattern 122 may be continuously connected to each other. The gate electrode 126 and the hard mask pattern 122 have an outside sidewall substantially perpendicular to the substrate 100.

Figure 15:
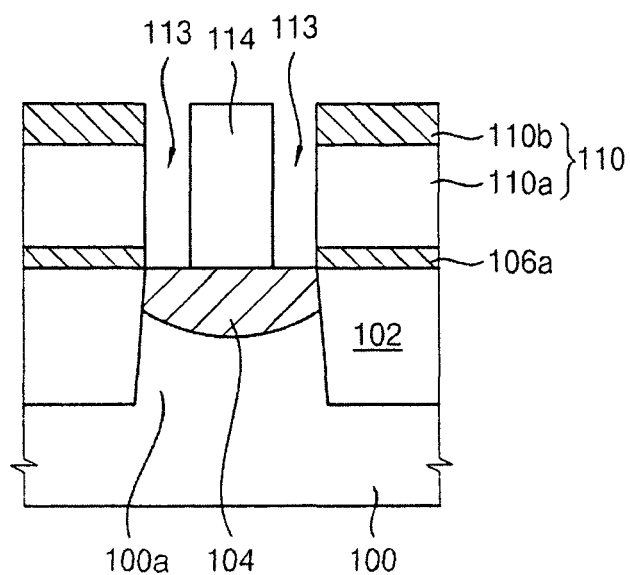
Figure 16:
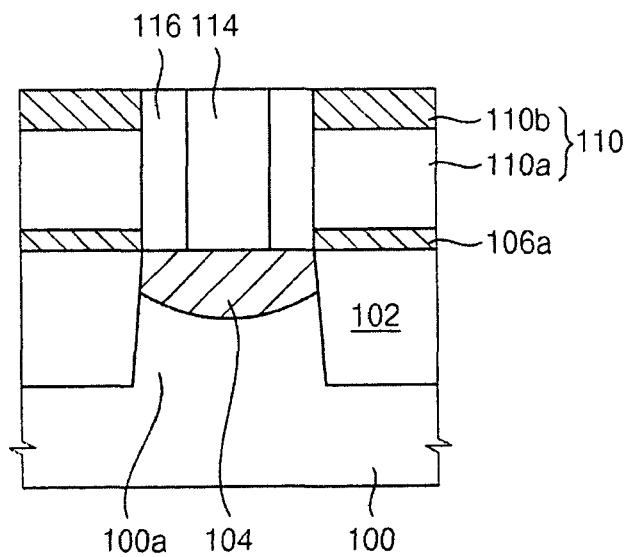

FIGS. 15 and 16 may be cross-sectional views illustrating other method of manufacturing the vertical pillar transistor in accordance with example embodiments. A method of manufacturing the vertical pillar transistor may be substantially the same as or similar to that described above except for a process of forming the preliminary channel patterns. Thus, the same reference numerals will be used to refer to the same or like elements as those described in example embodiments of FIG. 2 and any further explanation with respect to the same elements will be omitted.

A structure illustrated in FIG. 7 may be formed by processes described with reference to FIGS. 4 to 7. Referring to FIG. 15, the amorphous silicon pattern 112 may be selectively removed to form an opening partially exposing a surface of the substrate 100 corresponding to an active region 100a. The opening 113 has a trench shape exposing an edge portion of the active region 100a. Referring to FIG. 16, a selective epitaxial growth process using the exposed surface of the active region 100a as seed may be performed to form a preliminary channel pattern 116.

After forming the preliminary channel pattern 116, a planarization process for planarizing the preliminary channel pattern 116 may be further performed. For example, after a capping layer (not illustrated) may be formed on the first sacrificial layer pattern 110 and the preliminary channel pattern 116, the preliminary channel pattern 116 may be planarized until an upper face of the first sacrificial layer pattern 110 may be exposed.

A vertical pillar transistor including a plurality of channel regions along a direction substantially perpendicular to the substrate may be formed by performing processes substantially the same as those described with reference to FIGS. 8 to 14, and FIG. 1.

Figure 17:
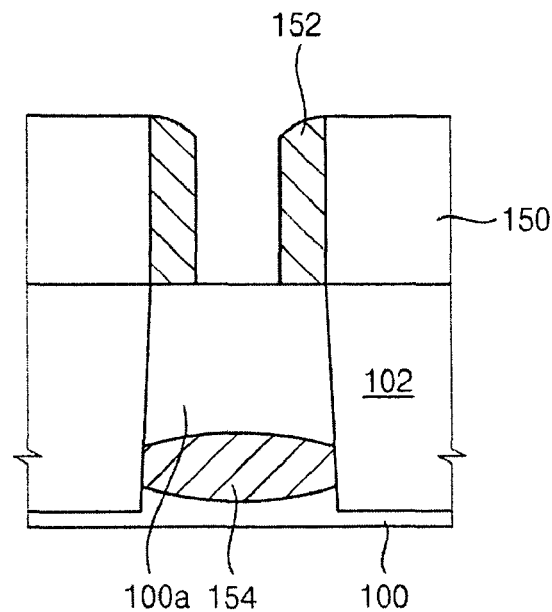

FIGS. 17 to 20 are cross-sectional views illustrating other method of manufacturing the vertical pillar transistor in accordance with example embodiments. Referring to FIG. 17, a shallow trench isolation process may be performed to the substrate 100 to form an isolation layer 102. Impurities may be implanted into the substrate 100 to form a first impurity region 154 under the substrate 100. The first impurity region 154 may be formed to be spaced apart from a surface of the substrate 100 with a predetermined or given distance.

A first hard mask layer may be formed on the substrate 100 and the first hard mask layer may be patterned to form a first hard mask pattern 150. The first hard mask pattern 150 selectively exposes the active region 100a. An insulation layer (not illustrated) may be formed on a sidewall of the first hard mask pattern 150. The insulation layer may be anisotropically etched to form a spacer pattern 152. The spacer pattern 152 selectively covers an edge portion of the active region 100a.

Figure 18:
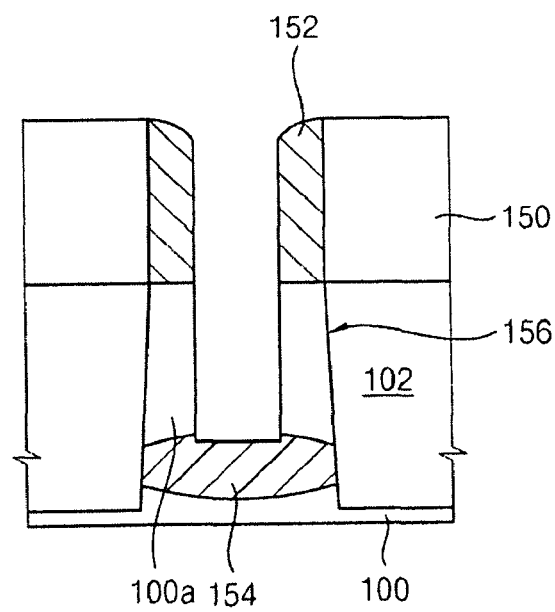

Referring to FIG. 18, the substrate 100 may be etched using the spacer pattern 152 and the first hard mask pattern 150 as etching masks. The edge portion of the active region 100a protrudes by the etching process. The protruding portion of the active region 100a has a linear shape extending along a first direction. The protruding portion corresponds to a preliminary channel pattern 156.

Figure 19:
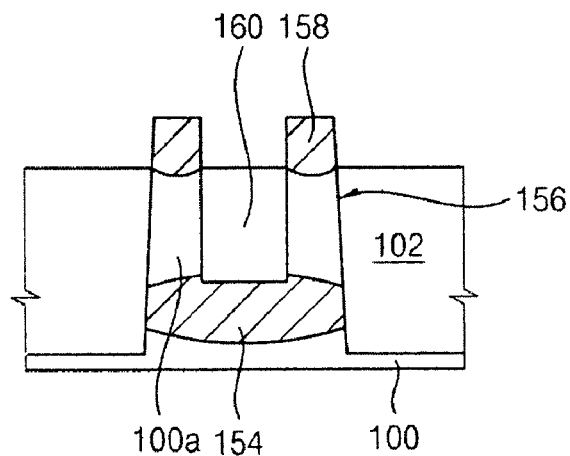

Referring to FIG. 19, a sacrificial layer (not illustrated) filling a gap between the preliminary channel patterns 156 may be formed. The sacrificial layer may be planarized. The spacer pattern 152 and the first hard mask pattern 150 may be removed. An upper portion of the isolation layer 102 and a portion of the sacrificial layer may be etched to expose an upper face and an upper sidewall of the preliminary channel pattern 156. A sacrificial layer pattern 160 filling a gap between the preliminary channel patterns 156 may be formed by partially etching the sacrificial layer.

Figure 20:
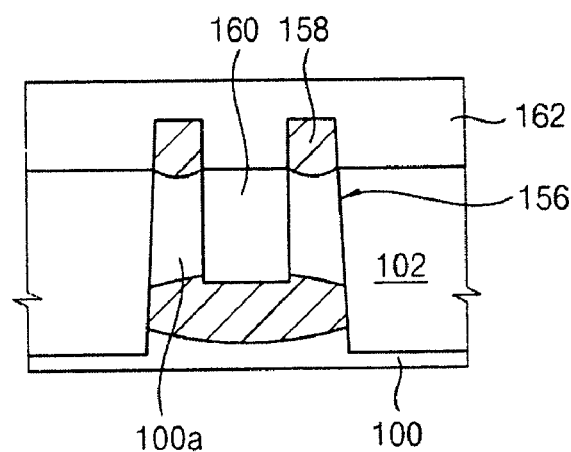

Impurities may be implanted into the upper portion of the preliminary channel pattern 156 to form a second impurity region 158. Referring to FIG. 20, a second hard mask layer (not illustrated) may be formed on the isolation layer 102 and the sacrificial layer pattern 160 to cover the preliminary channel pattern 156. The second hard mask layer may be patterned to form a hard mask pattern 162 extending along the second direction.

A vertical pillar transistor including a plurality of channel regions along a direction substantially perpendicular to the substrate may be formed by performing processes substantially the same as those described with reference to FIGS. 12 to 14 and 1.

Figure 21:
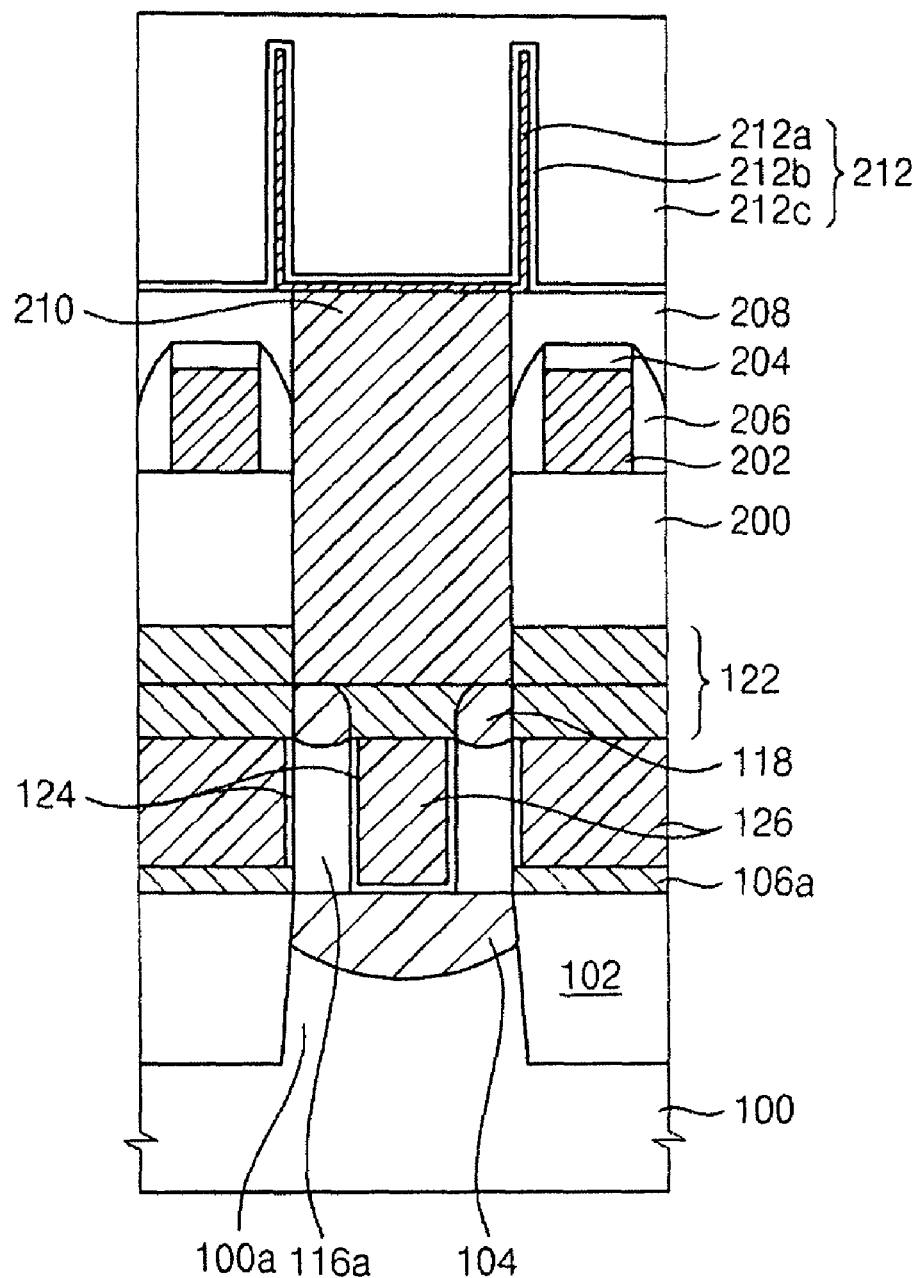

FIG. 21 is a cross-sectional view illustrating a DRAM device including a vertical pillar transistor in FIG. 1. The vertical pillar transistor may be included in a cell of a DRAM described in the following descriptions. Thus, the same reference numerals will be used to refer to the same or like elements as those described in the above descriptions and any further explanation with respect to the same elements will be omitted.

Referring to FIG. 21, vertical pillar transistors of array structures as illustrated in FIG. 1 may be formed on the substrate. A first insulating interlayer 200 covering the vertical pillar transistors may be formed on the substrate 100 and the etch stop layer 106a. A first contact plug (not illustrated) contacting the first impurity region 104 may be formed through the first insulating interlayer 200. The first contact plug may have a structure in which a landing pad contact and a direct contact may be connected to each other along a direction substantially perpendicular to the substrate 100.

A bit line 202 having a linear shape extending along the first direction may be formed on the first insulating interlayer 200. The bit line 202 may be electrically contacted with the first contact plug. A hard mask pattern 204 may be formed on the bit line 202. A spacer 206 may be formed on a sidewall of the bit line 202. A gap between the adjacent bit lines 202 may be filled with a second insulating interlayer 208. The second insulating interlayer 208 covers the bit lines 202.

A second contact plug 210 contacting upper faces of the channel patterns 116a may be formed through the first and second insulating interlayer 200 and 208. The second contact plug 210 may be interposed between the bit lines 202. The second contact plug 210 may be electrically insulated from the bit lines 202 and may be electrically connected to the second impurity region 118. The second contact plug 210 may include metal and/or polysilicon.

A capacitor 212 may be formed on the second contact plug 210. For example, the capacitor 212 may include a cylinder-shape capacitor including a lower electrode 212a, a dielectric layer 212b and an upper electrode 212c as illustrated in FIG. 21. Alternatively, the capacitor 212 may include a stack-shape capacitor in which a lower electrode 212a, a dielectric layer 212b and an upper electrode 212c are stacked.

Figure 22:
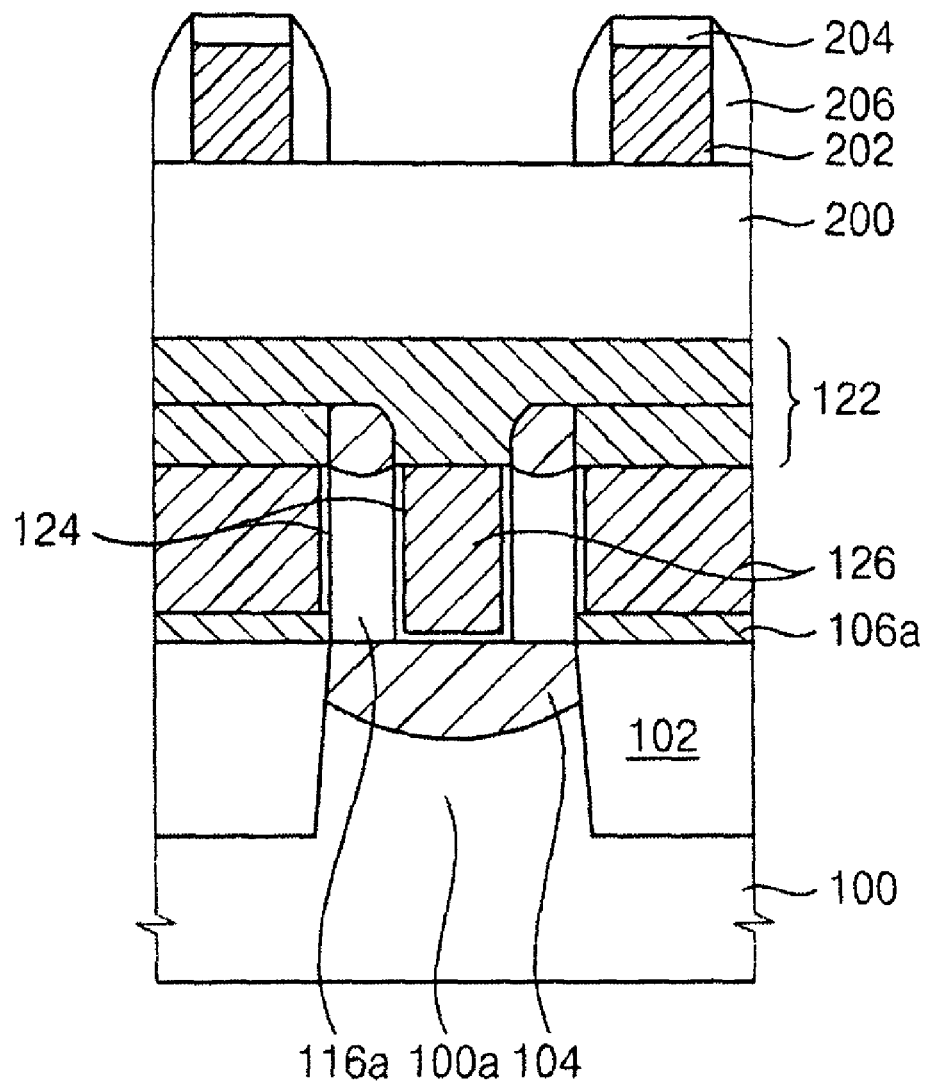
Figure 23:
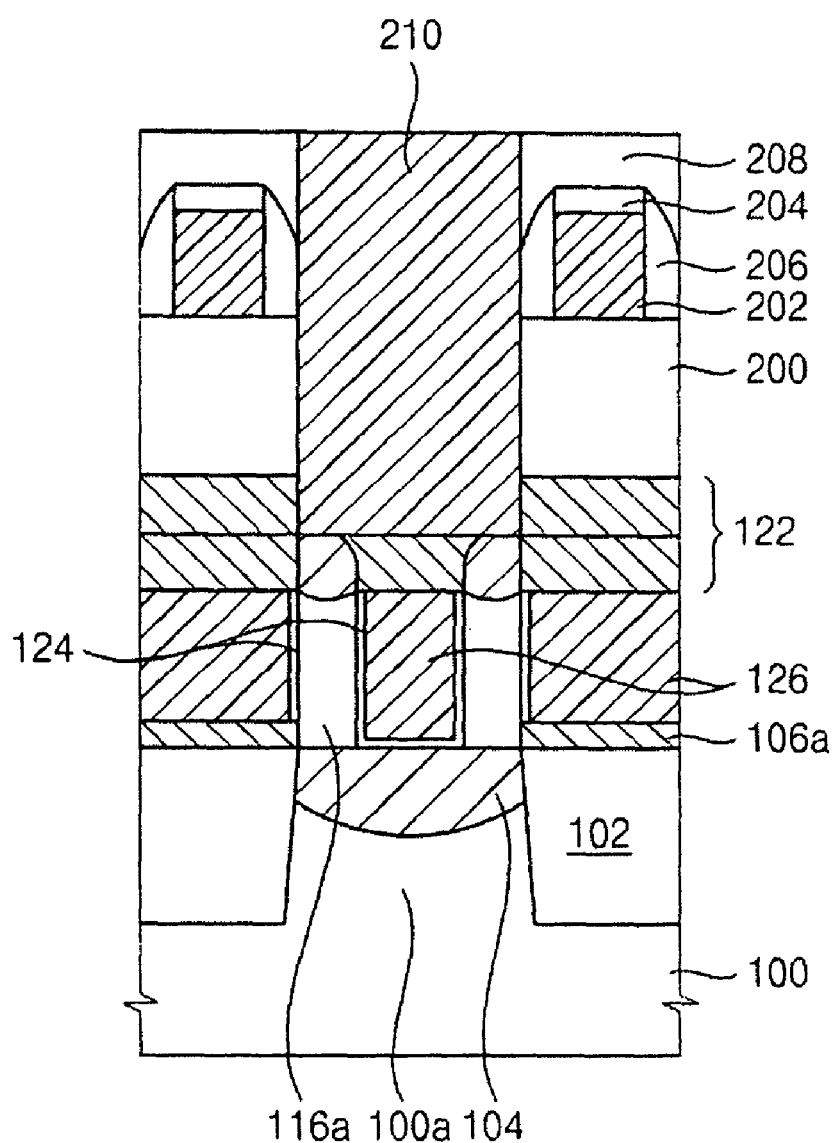

FIGS. 22 and 23 may be illustrating a method of manufacturing the vertical pillar transistor in FIG. 21. The DRAM device in FIG. 21 may be manufactured by performing successive processes after forming the vertical pillar transistor in FIG. 1. The vertical pillar transistor in FIG. 1 may be formed by the processes described with reference to FIGS. 4 to 14 and 1.

Referring to FIG. 22, a first insulating interlayer 200 may be formed on the substrate 100 and an etch stop layer pattern 106a to cover the vertical pillar transistor. The first insulating interlayer 200 may be formed by a CVD process using silicon oxide. The first insulating interlayer 200 may be partially etched to form a first contact hole exposing a surface of the substrate corresponding to an active region 100a. The first contact hole may be filled with a conductive layer. The conductive layer may be polished to expose the first insulating interlayer 200. A first contact plug (not illustrated) connected to the first impurity region may be formed.

A conductive layer for a bit line may be formed on the first contact plug and the first insulating interlayer 142. The conductive layer for a bit line may be formed using polysilicon, metal and/or metal silicide. These may be used in alone or a combination thereof. A hard mask pattern 204 may be formed on the conductive layer for a bit line. The hard mask pattern 204 may be formed by sequentially depositing and patterning a silicon nitride layer. The hard mask pattern 204 opposes to the first contact plug and has a linear shape extending to the first direction.

The conductive layer for a bit line may be anisotropically etched using the hard mask pattern 204 as an etching mask to form a bit line 202. The bit line 202 may be interposed between channel patterns 116a parallel to each other. An insulation layer for a spacer (not illustrated) may be formed on the bit line 202, the hard mask pattern 204 and the first insulating interlayer 200. The insulation layer for a spacer may be anisotropically etched to form a spacer 206 on sidewalls of the bit line 202 and the hard mask pattern 204. The spacer 206 may be formed using silicon nitride.

The first and second insulating interlayers 200 and 208 exposed by the bit line 202 may be partially and anisotropically etched to form a second contact hole exposing an upper face of the channel pattern 116a. The anisotropic etching process may include a self-align contact process using an etching selectivity between the spacer 206 and the second insulating interlayer 208.

The second contact hole may be filled with conductive material. The second contact plug 210 may be formed by polishing the conductive material until an upper face of the second insulating interlayer 208 is exposed. The conductive material may include metal, so that a resistance of the second contact plug 210 may be reduced. Alternatively, the conductive material may include polysilicon.

As illustrated in FIG. 21, a capacitor 212 may be formed on the second contact plug 210. For example, the capacitor 212 may include a cylinder-shape capacitor including a lower electrode 212a, a dielectric layer 212b and an upper electrode 212c. Alternatively, the capacitor 212 may include a stack-shape capacitor in which a lower electrode 212a, a dielectric layer 212b and an upper electrode 212c may be stacked.

Figure 24:
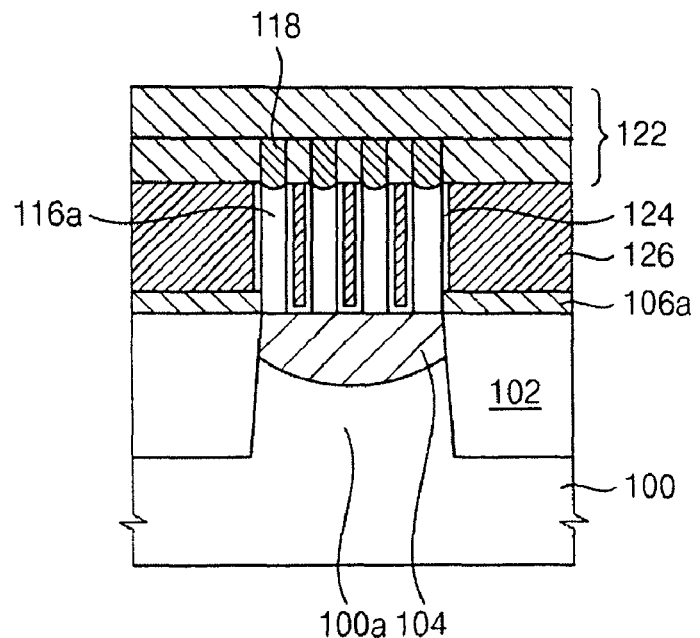

FIG. 24 is a cross-sectional view illustrating a vertical pillar transistor in accordance with example embodiments. As illustrated in FIG. 24, a vertical pillar transistor in FIG. 24 may be substantially the same as or similar to the vertical pillar transistor in FIG. 1 except for that four channel patterns may be separately arranged on an active region 100a along a direction to which gate electrode extends. When the vertical pillar transistor in FIG. 24 is operated, channels may be formed in the four channel patterns 116a, respectively. Accordingly, on-currents may be increased compared to the vertical pillar transistor in FIG. 1. Thus, undesirable problems due to leakage current may be reduced.

Figure 25:
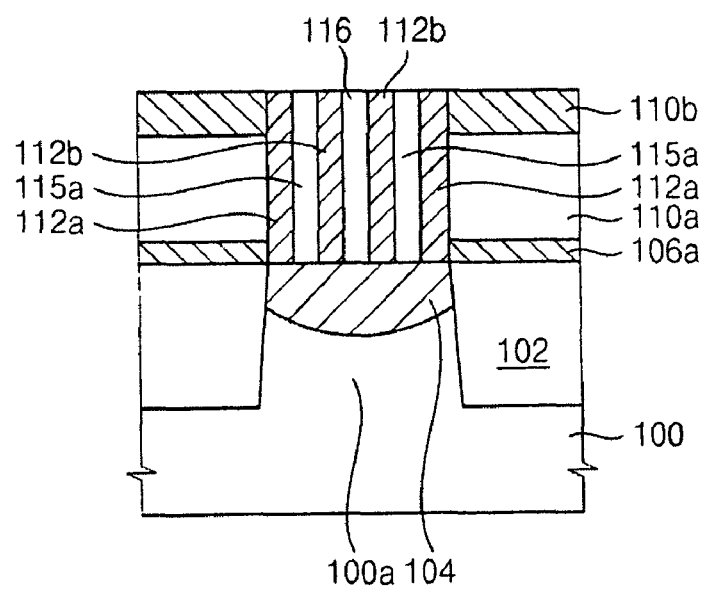

FIG. 25 is a cross-sectional view illustrating a method of manufacturing the vertical pillar transistor in accordance with example embodiments. A method of manufacturing the vertical pillar transistor in FIG. 24 may be substantially the same as that of the vertical pillar transistor in FIG. 1 except for processes of forming the four channel patterns. A structure in FIG. 6 may be formed by performing processes substantially the same as those described with reference to FIGS. 4 to 6.

Referring to FIG. 25, a second sacrificial layer may be formed along upper faces of the amorphous silicon pattern 112a, the substrate 100 and the first sacrificial layer pattern 110b. The second sacrificial layer may be anisotropically etched to form a second sacrificial layer pattern 115a having a spacer shape may be formed.

Alternatively, a second amorphous silicon layer may be formed to fill a gap between the second sacrificial layer patterns 115a. In example embodiments, three channel patterns may be formed on the unit active region 100a. The second amorphous silicon layer may be anisotropically etched to form a second amorphous silicon patterns 112b having a spacer shape.

A gap between the second amorphous silicon patterns 112b may be filled with a third sacrificial layer. The third sacrificial layer may be polished to form a third sacrificial layer pattern until an upper face of the first sacrificial layer pattern 110b may be exposed.

As not illustrated, processes substantially the same as those described with reference to FIGS. 9 to 14 and 1 may be performed to form the vertical pillar transistor in FIG. 24. Also, after forming the vertical pillar transistor in FIG. 24, a DRAM device including the vertical pillar transistor in FIG. 24 may be formed by further performing successive processes.

According to example embodiments, the channel patterns may be formed on a narrow active region and a transistor having the channel patterns may have a higher on-current. Thus, a semiconductor device having the transistor may have improved operation characteristics. Especially, the vertical pillar transistor may be used in a memory device requiring an array structure.

The foregoing may be illustrative of example embodiments and may be not to be construed as limiting thereof. Although a few example embodiments have been described, those skilled in the art will readily appreciate that many modifications may be possible in the example embodiments without materially departing from the novel teachings and advantages of example embodiments. Accordingly, all such modifications are intended to be included within the scope of the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a vertical pillar semiconductor device, comprising:

forming a first impurity region in an active region of a substrate;

forming an etch stop layer on the active region and an isolation region of the substrate;

removing a portion of the etch stop layer to form an etch stop pattern on the isolation region;

forming a group of parallel channel patterns on the substrate;

forming a gate insulation layer on a surface of the substrate and a sidewall of the group of channel patterns, the gate insulation layer spaced apart from an upper face of the group of channel patterns;

forming a gate electrode contacting the gate insulation layer and enclosing the sidewall of the group of channel patterns; and forming a hard mask pattern on the etch stop pattern, the hard mask pattern on an upper portion of the sidewall and on the gate electrode.

2. The method of claim 1, further comprising forming a first sacrificial layer pattern exposing the active region;

wherein the forming a group of parallel channel patterns includes forming amorphous silicon spacers on a sidewall of the first sacrificial layer pattern;

forming a second sacrificial layer pattern to fill a gap between the amorphous silicon spacers; and performing phase-transition of the amorphous silicon spacers into single crystalline silicon.

3. The method of claim 2, wherein the forming a group of parallel channel patterns includes performing the phase transition by one of a laser epitaxial growth (LEG) process and a solid phase epitaxial growth (SPE) process.

4. The method of claim 2, wherein the forming a first sacrificial layer pattern includes stacking a lower pattern including a first material and an upper pattern of insulation material including a second material with etch selectivity to the first material.

5. The method of claim 4,
wherein the forming a hard mask pattern includes,
forming a hard mask layer on the first and second sacrificial layer patterns,
forming the hard mask pattern by patterning the hard mask layer and the upper pattern of the first sacrificial layer pattern, and
removing the second sacrificial layer pattern and the lower pattern of the first sacrificial layer pattern.

6. The method of claim 5, wherein the forming a gate electrode includes,
forming a conductive layer filling a space below the hard mask pattern; and
patterning the conductive layer to remove a portion of the conductive layer exposed by the hard mask pattern.

7. A method of manufacturing a vertical pillar semiconductor device, comprising:
forming a group of channel patterns on a substrate divided into an active region and an isolation layer, the group of channel patterns arranged parallel to each other and a first impurity region formed in the substrate corresponding to the active region;
forming a gate insulation layer on a surface of the substrate and a sidewall of the group of channel patterns, the gate insulation layer spaced apart from an upper face of the group of channel patterns; and
forming a gate electrode contacting the gate insulation layer and enclosing the sidewall of the group of channel patterns,
wherein the forming a group of channel patterns includes,
forming a first sacrificial layer pattern exposing the active region,
forming amorphous silicon spacers on a sidewall of the first sacrificial layer pattern,
forming a second sacrificial layer pattern to fill a gap between the amorphous silicon spacers, and
performing phase-transition of the amorphous silicon spacers into single crystalline silicon.

8. A method of manufacturing a vertical pillar semiconductor device, comprising:
forming a first impurity region in an active region of a semiconductor layer;
forming an etch stop layer and a sacrificial layer on the semiconductor layer;
forming an etch stop pattern and a first sacrificial pattern by removing a portion of the etch stop layer and the sacrificial layer forming a second sacrificial pattern spaced apart from sidewalls of the etch stop pattern and the first sacrificial pattern;
forming a plurality of separated channel patterns each including a first end connected to the first impurity region and a second end including a second impurity region,
the forming the plurality of separated channel patterns including epitaxially growing the channel patterns from an exposed surface of the active region between the first and second sacrificial patterns using selective epitaxial growth (SEG);
forming a gate insulation layer on sidewalls of the plurality of channel patterns and on a surface of the semiconductor layer between the channel patterns; and
forming a gate electrode on the gate insulation layer, the gate electrode extending across the surface on the gate insulation layer from a sidewall of a first channel pattern of the channel patterns to a sidewall of a second channel pattern of the channel patterns.

9. The method of claim 8, further comprising:
trimming a central portion of each of the channel patterns.

10. The method of claim 8, wherein the forming a plurality of separated channel patterns includes forming at least 4 separated channel patterns connected to the first impurity region.

11. The method of claim 8, wherein
the forming a first impurity region includes forming the first impurity region by introducing an impurity of a first conductive type into the active region, and
the forming a plurality of separated channel patterns includes forming the second impurity regions by introducing an impurity of a second conductive type, the first conductive type being different from the second conductive type.

* * * * *